United States Patent [19]

Okutani

[11] Patent Number: 5,140,240
[45] Date of Patent: Aug. 18, 1992

[54] ENCODER

[75] Inventor: Norio Okutani, Neyagawa, Japan

[73] Assignee: Matsushita Electric Industrial Co., Ltd., Osaka, Japan

[21] Appl. No.: 601,660

[22] Filed: Oct. 25, 1990

[30] Foreign Application Priority Data

Oct. 25, 1989 [JP] Japan .................. 1-279343

[51] Int. Cl.$^5$ ........................... H03K 13/02
[52] U.S. Cl. ...................... 318/608; 318/603; 318/659; 318/660; 318/661; 318/254
[58] Field of Search ............... 318/560-686, 318/254, 138; 324/160-169; 341/1, 3, 7, 9, 13, 137; 250/231.18, 231.16, 213.14

[56] References Cited

U.S. PATENT DOCUMENTS

| | | | |
|---|---|---|---|
| 3,760,170 | 4/1973 | Weber, Jr. | 318/570 X |
| 3,851,330 | 11/1974 | Huber. | |
| 4,216,415 | 8/1980 | Shimonou et al. | 318/600 |
| 4,305,029 | 12/1981 | Takahashi | 318/603 |
| 4,445,110 | 4/1984 | Breslow. | |
| 4,465,928 | 8/1984 | Breslow | 250/231 SE |
| 4,524,347 | 6/1985 | Rogers | 340/347 P |
| 4,546,299 | 10/1985 | Veale | 318/608 |
| 4,551,708 | 11/1985 | Welburn | 318/661 |
| 4,628,298 | 12/1986 | Hafle et al. . | |
| 4,686,437 | 8/1987 | Langley et al. | 318/254 |
| 4,786,891 | 11/1988 | Ueda et al. | 341/13 |
| 4,884,016 | 11/1989 | Aiello | 318/685 |
| 4,943,760 | 7/1990 | Byrne et al. | 318/701 |
| 4,990,909 | 2/1991 | Ueda et al. | 250/231.14 X |
| 4,999,558 | 3/1991 | Onodera et al. | 318/685 |
| 5,003,238 | 3/1991 | Lum et al. | 318/592 |

*Primary Examiner*—Paul Ip
*Attorney, Agent, or Firm*—Wenderoth, Lind & Ponack

[57] ABSTRACT

A rotational position detection encoder includes at least two detection heads located along a slit string of a code plate. The detection signals of one of the detection heads are processed to generate a plurality of phase offset signals having successively differing phases with respect to each other. The phase offset signals are compared with the detection signals of another of the detection heads, and the phase offset signals having a phase closest to that of the detection signals of the other detection head are selected and added to the detection signals of the other detection head. As such, detection signals having conforming phases are obtained without minute positional adjustment of the detection heads.

1 Claim, 2 Drawing Sheets

ENCODER

BACKGROUND OF THE INVENTION

The present invention generally relates to an encoder, and more particularly, to an encoder provided with a plurality of detection heads.

Generally, encoders are known which offset the errors of the positional detection signals caused by the off-center rotation of the slit string of a code plate relative to the rotation center of the code plate itself by the disposition of a plurality of detection heads for one code plate, thus making possible positional detection with a high accuracy.

However, in the case in which a plurality of detection heads are provided as described hereinabove, the position of one detection head, namely, the arrangement position of the mask or the detector, must be adjusted with respect to the other detection head, so that the phase of the detection signal between the detection heads may come into conformity, and it is necessary to effect a positional setting of approximately several μm in the high resolution encoder, with a problem resulting in that considerably more time is required.

SUMMARY OF THE INVENTION

Accordingly, the present invention has been developed with a view to substantially eliminating the above discussed drawbacks inherent in the prior art, and has for its essential object to provide an improved encoder.

Another important object of the present invention is to provide an improved encoder which is capable of easily effecting the positional adjustments of the detection heads in an encoder provided with a plurality of detection heads.

In accomplishing these and other objects, according to one preferred embodiment of the present invention, there is provided an encoder having at least two detection heads located along a slit string of a code plate. Each of the detection heads generates first and second detection signals in accordance with a rotation of the code plate. The first and second detection signals have different phases by 90° relative to each other. Processing circuitry is provided for processing the first and second detection signals of one of the detection heads to obtain first and second phase selected signals. The processing circuitry includes circuitry for generating, from the first and second detection signals of one of the detection heads, a plurality of phase offset signals having differing phases relative to each other. The processing circuitry also includes a select switch for selecting, as the first and second phase selected signals, two signals from among the phase offset signals having respective phases which most closely conform to the phases of the first and second detection signals of another of the detection heads. Adding circuitry is provided for adding the first phase selected signal and the first detection signal of the other of the detection heads to obtain a first phase output signal, and for adding the second phase selected signal and the second detection signal of the other of the detection heads to obtain a second phase output signal. The first and second phase output signals denote the rotational position of the code plate.

According to the above described construction of the present invention, a plurality of detection heads are respectively arranged in proper positions, and a signal which is generated based on the detection signal of one of the detection heads and which has a phase closest to the detection signals of another of the detection heads, is added to the detection signals of the other of the detection heads. Accordingly, a detection signal conforming in phase may be obtained without mechanical positional adjustment of the detection head positions, and the mounting operation of the detection heads is thereby facilitated.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
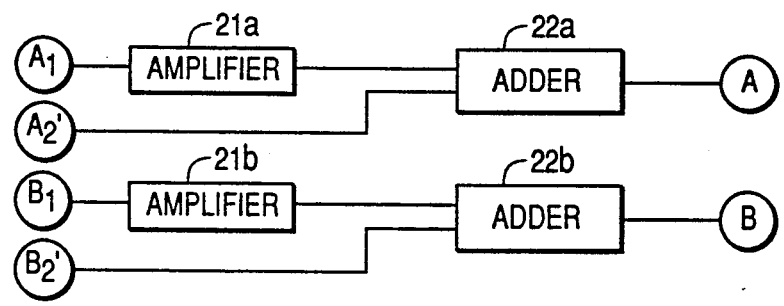
FIG. 1 is a block diagram of a detection signal processing circuit of an encoder in one embodiment of the present invention.

Before the description of the present invention proceeds, it is to be noted that like parts are designated by like reference numerals throughout the accompanying drawings.

One embodiment of the present invention will be described hereinafter with reference to FIG. 1 through FIG. 3.

Figure 3:
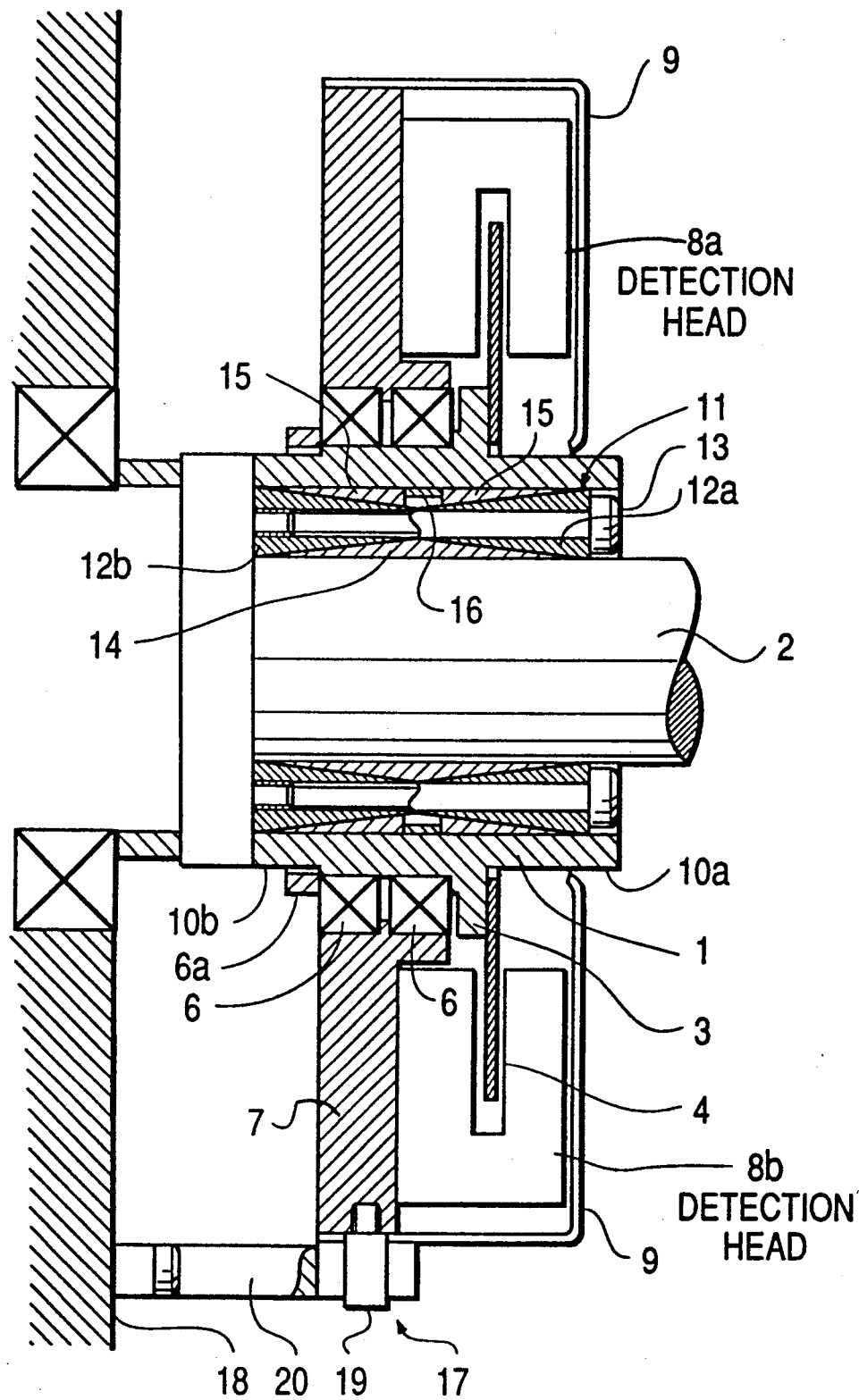
FIG. 3 is a longitudinal sectional side view showing a schematic construction of an encoder.

According to the schematic construction of the encoder shown in FIG. 3, a hollow rotary shaft 1 is externally engaged with a measured shaft 2, with a support flange 3 of a code plate 4 being provided on the external periphery thereof. The internal peripheral portion of the code plate 4 is fixed to a receiving face of the support flange 3. The hollow rotary shaft 1 is rotatably supported by a support member 7 (composed of a ring plate) through a pair of ball bearings 6. A pair of detection heads 8a, 8b for detecting the rotation position of the code plate 4 are disposed, on the support member 7, at an interval of 180°. The detection heads 8a, 8b are adapted to apply laser light energy to the code plate 4 using a laser light source to create shading stripes of a Fraunhofer diffraction image caused by slits formed regularly in the code plate 4, whereby detection signals of an artificial sine wave having a phase difference of 90° relative to each other are output in accordance with the light energy detection of a light detector.

A cover 9 covers the code plate 4 and the detector 8. The external peripheral portion of the cover 9 is fixed to the external periphery of the support member 7. A fixed nut 6a of the bearing 6 is screwed into the external periphery of the hollow rotary shaft 1. The external peripheral face of both end portions on the axial external side from the cover 9 of the hollow rotary shaft 1 and the fixed nut 6a are formed on the measuring faces 10a, 10b formed in the same axial condition as the code plate 4.

A fixing means 11 is interposed between the external peripheral face of the shaft 2 and the internal peripheral face of the hollow rotary shaft 1, and is adapted to fix and axially adjust the hollow rotary shaft 1 to the shaft 2. The fixing means 11 is composed of clamping means comprising a pair of wedge shaped sleeves 12a, 12b which are attracted towards each other by a clamping bolt 13, an angular sleeve 14 to be engaged with the internal peripheries of the wedge shaped sleeves 12a, 12b, and an angular sleeve 15 to be engaged with the external periphery of the wedge shaped sleeves 12a, 12b. The angular sleeve 15 of the external periphery is divided into two portions at the axial direction central position, and a distance piece for adjustment 16 is interposed between the two portions. Also, a coupling means 17 fixes the support member 7 only in the rotating direction, is coupled to a fixing portion 18 in a floatable condition in the other direction, and is provided on the external periphery of the support member 7. The coupling means 17 is composed of an engagement pin 19 projected in a radial direction from the support member 7, and a bracket 20 for slidably grasping the engagement pin 19 from both the peripheral direction sides.

For mounting the encoder onto the shaft 2 to be measured, the hollow rotary shaft 1 is externally engaged with the shaft 2. The fixing means 11 having the clamping bolt 13 is interposed between the internal peripheral face of the hollow rotary shaft 1 and the external peripheral face of the shaft 2. Further, the engagement pin 19 projects from the support member 7 and is grasped by the bracket 20, and the shaft 2 to be measured and the hollow rotary shaft 1 are fixed to each other by the clamping of the clamping bolt 13. Thereafter, the eccentricity of the hollow rotary shaft 1 is measured with a dial gauge applied against the measuring faces 10a, 10b while the shaft 2 is rotated. Axial adjustment is carried out by slightly loosening the clamping bolt 13 to position the axial center of the hollow rotary shaft 1 so as to remove any eccentricity thereof, and by then clamping the clamping bolt 13 again to fix the shaft 2 to be measured and the hollow rotary shaft 1 having the same axial center.

The circuit for processing the detection signals from the detection heads 8a, 8b will be described hereinafter with reference to FIG. 1 and FIG. 2. The detection signals having differing phases by 90° to be output from the detection heads 8a and 8b are respectively denoted A1, B1 (for head 8a) and A2, B2 (for head 8b). The signals generated by processing the detections signals A2, B2 from the detection head 8b are denoted A2', B2' and have phases set to in accordance with the detection signals A1, B1 from the detection head 8a. The signals obtained by the addition of the detection signals A1, A2' and B1, B2' are output from the encoder having a phase difference of 90° relative to each other and are denoted A, B.

Referring to FIG. 1, the detection signals A1, B1 from the detector 8a are respectively amplified by the amplification circuits 21a, 21b, and the amplified results are input to the addition circuits 22a, 22b. The signals A2', B2' output from the circuit for processing the detection signals A2, B2 of the detector 8b shown in FIG. 2 are also input to the addition circuits 22a, 22b. The addition of the signals A1 and A2' is output as the A phase signal, and the addition of the signals B1 and B2' is output as the B phase signal.

Figure 2:
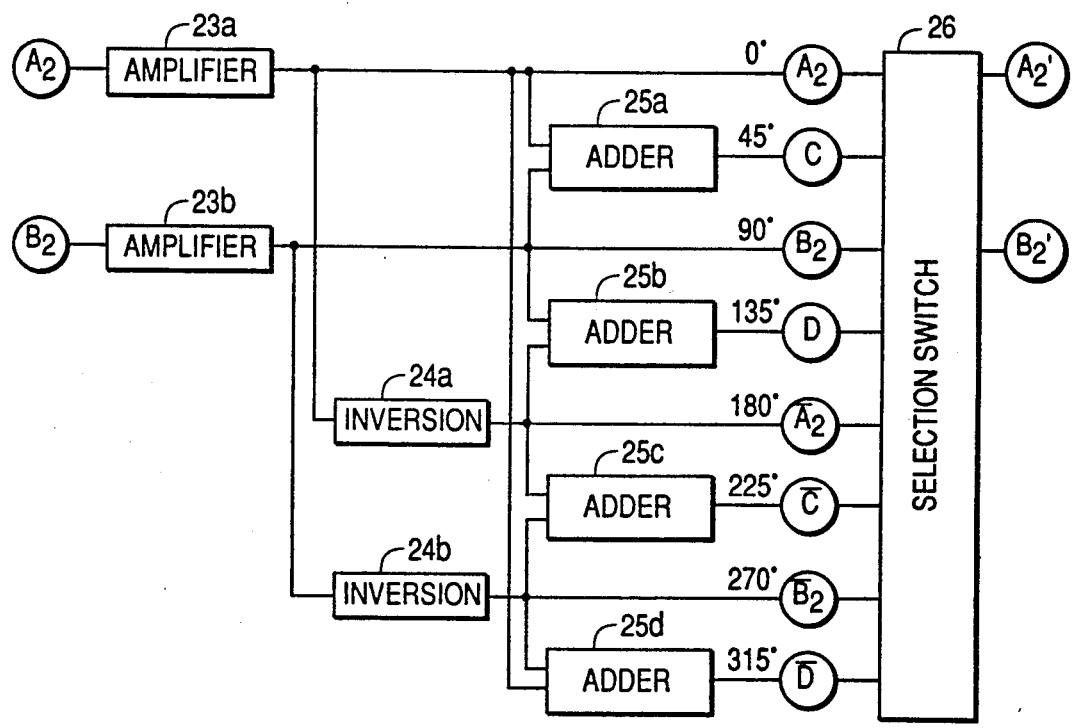
FIG. 2 is a block diagram of a circuit for generating and selecting multiple signals of different phases from a pair of detection signals.

In the signal processing circuit of FIG. 2, the signals A2, B2 from the detector 8b are respectively amplified by the amplification circuits 23a, 23b, and the thus amplified signals are input in a selection switch 26. Also, the output signals from the amplification circuits 23a, 23b are respectively input to the inversion circuits 24a, 24b, and the thus inverted signals are inputted to the selection switch 26. Further, the amplified detection signals A2 and B2 are input to the addition circuit 25a. The amplified detection signal B2 and the inverted signal of A2 output from the inversion circuit 24a are input to the addition circuit 25b. The inverted signal of A2 and the inverted signal of B2 are input to the addition circuit 25c. The inverted signal of B2 and the amplified detection signal A2 are input to the addition circuit 25d. The output signals of the addition circuits 25a through 25d are also input to the selection switch 26. Denoting the output signals of the addition circuits 25a and 25b as signals C, D, the output signals of the addition circuits 25c and 25c become the inverted signals of the signals C, D. The eight signals A2, C, B2, D, A2 inverted, C inverted, B2 inverted, and D inverted have sequentially different phases by 45° relative to each other and are input to the selection switch 26. The selection switch 26 is adapted to select two signals from among the eight signals and to output the selected signals as the output signals A2', B2'.

According to the above described construction, after the measured shaft 2 has been fixed to the encoder as described hereinabove, the waveform of an output signal A1 or B1 of the detection head 8a and the waveform of each signal to be input to the selection switch 26 are checked. The signals having phases closest to the phases of the output signals A1, B1 are selected by the selection switch 26 as the output signals A2', B2' for the detection head 8b. As shown in FIG. 1, the sum of the detection signals A1 and A2' for the detection heads 8a, 8b is output as the A phase detection signal and the sum of the detection signals B1 and B2' for the detection heads 8a, 8b is output as the B phase detection signal by the addition circuits 22a, 22b, respectively.

Thus, the output signals may be set to conform in phase without minute positional adjustment of the respective detection heads 8a, 8b. Also, by the use of the output signals of the two detection heads 8a, 8b, the errors caused by the eccentric rotation of the code plate 4 or the slit string thereof are offset, and also a detection signal having a dual output is obtained.

Although the phases of the detection signals of the detectors 8a, 8b may be set with greater accuracy if the number of the signals to be generated in accordance with the detection head 8b is increased, the phase offset is ±22.5° at maximum and the error of the output signal is $(1 - \cos 22.5°) =$ approximately 3% if eight signals are generated as in the above described embodiment, so that sufficient accuracy is practically obtained.

Although the above example entails a pair of detection heads as shown in the described embodiment, three detection heads may be used to compensate the eccentricity in all the directions. Even in this case, the signal phase of the other two detection heads has only to be set with the detection signal of the remaining detection head as the reference as in the above described embodiment. Although the output signal after the signal from each detector in the detection head has been processed is used in the above described embodiment, the above described processing may be adapted to be effected in advance with respect to the signal from the detector.

As is clear from the above description, according to the arrangement of the present invention, in an encoder provided with a plurality of detection heads, the respective detection heads are respectively disposed in the proper positions, a signal having a phase closest to a signal different in phase generated from the detection signal in an other detection head is selected, fetched by the selection means with respect to a detection signal in one detection head as the reference, with the effect being that a detection signal conformed in the phase may be obtained without minute positional adjustment, and the mounting operation of a plurality of detection head may be completed with an extremely simple operation.

Although the present invention has been fully described by way of example with reference to the accompanying drawings, it is to be noted here that various changes and modifications will be apparent to those skilled in the art. Therefore, unless otherwise such changes and modification depart from the scope of the present invention, they should be construed as included therein.

What is claimed is:

1. A rotational position detection encoder comprising:

at least two detection heads located along a slit string of a code plate, each of said at least two detection heads generating first and second detection signals in accordance with a rotation of said code plate, said first and second detection signals differing in phase by 90° relative to each other;

processing means for processing said first and second detection signals of one of said at least two detection heads to obtain first and second phase selected signals, said processing means including (a) means for generating, from said first and second detection signals of said one of said at least two detection heads, a plurality of phase offset signals having differing phases relative to each other, and (b) select means for selecting, as said first and second phase selected signals, two signals from among said phase offset signals having respective phases which most closely conform to the phases of said first and second detection signals of an other of said said at last two detection heads; and, adding means for adding said first phase selected signal and said first detection signal of said other of said at least two detection heads to obtain a first phase output signal, and for adding said second phase selected signal and said second detection signal of said other of said at least two detection heads to obtain a second phase output signal, wherein the first and second phase output signals denote the rotational position of the code plate.

* * * * *